United States Patent [19]

Walter

[11] 4,261,808
[45] Apr. 14, 1981

[54] VACUUM COATING APPARATUS WITH CONTINUOUS OR INTERMITTENT TRANSPORT MEANS

[75] Inventor: Heinz Walter, Hanau, Fed. Rep. of Germany

[73] Assignee: Leybold-Heraeus GmbH, Cologne, Fed. Rep. of Germany

[21] Appl. No.: 971,275

[22] Filed: Dec. 20, 1978

[30] Foreign Application Priority Data

Oct. 12, 1978 [DE] Fed. Rep. of Germany ....... 2844491

[51] Int. Cl.³ .................... C23C 15/00; C23C 13/10
[52] U.S. Cl. ................... 204/298; 118/324; 118/503; 118/719; 118/725; 118/729; 118/733
[58] Field of Search ........ 118/49.1, 50.1, 48, 118/49, 324, 503, 719, 729, 725, 733, 715; 204/298

[56] References Cited

U.S. PATENT DOCUMENTS

| | | | |
|---|---|---|---|
| 3,132,966 | 5/1964 | Hughes et al. | 118/324 |
| 3,288,700 | 11/1966 | Needham et al. | 204/298 |
| 3,596,285 | 7/1971 | Gottwald | 118/324 |
| 3,873,025 | 3/1975 | Quarnstrom | 118/324 |
| 3,931,789 | 1/1976 | Kakei et al. | 118/503 |
| 4,062,319 | 12/1977 | Roth et al. | 204/298 |
| 4,131,533 | 12/1978 | Bialko et al. | 204/298 |
| 4,149,923 | 12/1978 | Uehara et al. | 204/298 |

FOREIGN PATENT DOCUMENTS

| | | |
|---|---|---|
| 841626 | 7/1949 | Fed. Rep. of Germany. |
| 1183337 | 7/1965 | Fed. Rep. of Germany. |
| 1236900 | 5/1969 | Fed. Rep. of Germany. |
| 2415119 | 3/1974 | Fed. Rep. of Germany. |
| 2420430 | 2/1976 | Fed. Rep. of Germany. |

OTHER PUBLICATIONS

Byrne, T. M. et al., IBM Tech. Discl. Bulletin, pp. 1034–1036, vol. 13, No. 4, 10/1970.

*Primary Examiner*—Charles L. Bowers, Jr.
*Attorney, Agent, or Firm*—Sprung, Felfe, Horn, Lynch & Kramer

[57] ABSTRACT

Vacuum coating apparatus having a vacuum chamber containing at least one cathode system and having a system for the continuous or intermittent transport of substrates during the coating. The transport system includes flexible, endless conveyor means in pairs guided in the manner of two parallel chain drives over wheel pairs positioned at a distance from one another in the formation of two straight runs. The substrates are fastened to the conveyors so as to be movable parallel to the cathode system. The straight runs of each endless conveyor is guided vertically at least in the area of the cathode systems.

9 Claims, 7 Drawing Figures

VACUUM COATING APPARATUS WITH CONTINUOUS OR INTERMITTENT TRANSPORT MEANS

BACKGROUND

This invention relates to a vacuum coating apparatus having a vacuum chamber, having at least one cathode system, and having a system for the continuous transport of the substrates during the coating process, including endless transport means disposed pair-wise, which are guided in the manner of two parallel chain drives over sets of two wheels set apart from one another, thereby forming two straight runs, and to which the substrates can be fastened, thus enabling the substrates to be moved parallel to the cathode system.

In vacuum coating apparatus which are designed for a high throughput, the main problem lies in a precise and trouble-free transport of the largest possible number of substrates per unit of time through the actual coating zone or, in some cases, through a plurality of coating zones, and in some cases through still other pretreatment and after-treatment zones. It can be assumed that such treatment zones contained within a relatively larger vacuum chamber are separated from one another either by their principle of operation, and/or by special shielding, partition walls, etc. Examples of treatment stations are cathode sputtering systems, cathodic etching systems or glow discharge systems, preheating and afterheating stations, etc. In large industrial installations, the continuous or intermittent transport of substrates calls for appropriate mechanical construction measures, which inevitably produce at least some detritus, and inevitably, too, some of the coating material condenses upon the internal parts of the apparatus, and after a time it begins to flake off, resulting in the danger of contamination of the substrates.

When vacuum chambers are divided for the purpose of different process steps, it is customary to separate the compartments by means of flap valves. This necessitates separate transport systems for each chamber and complex electrical control and synchronization.

It is also possible to pass the substrates including their transport means through a number of chambers, in which case the partition walls contain slots for the passage of the substrates, and these slots are filled up as completely as possible by the substrate frames so as to prevent contamination. The passage of the substrate through the partition walls, however, requires high precision in the transport means. In addition, for the purpose of attaining short pump-down time, the volume of the chamber must be reduced to a minimum. These requirements are in some ways diametrically opposed, at least in large industrial plants, so that continuously or intermittent operating vacuum coating installations have hitherto not been widely used in practice.

German DDS No. 2,415,119 has disclosed a coating system of the general class described above, which consists substantially of a single, hollow-cylindrical cathode system, i.e., anode and cathode are constructed as portions of the periphery of a hollow cylinder surrounding the sputtering zone and provided with a plurality of longitudinal slits. The substrates are transported by means of a horizontal chain conveyor through a segment at the bottom of the horizontal, hollow-cylindrical cathode system, preferably in the horizontal position so that they can be coated on one side only. This means, of course, that the substrates can also run vertically to reduce the danger of contamination, but in this case evidently all that is thought of is substrates in a vertical position on the horizontal transport system. For stacking chambers containing substrate magazines or vacuum locks are to be situated at both ends of the sputtering chamber. However, the danger of contamination cannot be reduced in the described manner to the desirable degree. Contamination apparently was not very important in this known apparatus, since the embodiment presented is a laboratory system whose vacuum chamber is composed to an important degree of a glass receptacle. In the application of this principle of construction to a large industrial installation, the amount of space required in the horizontal direction is great, the cathodes are poorly accessible, and the sealing of the gaps in the individual partitions of the vacuum chamber is very unsatisfactory unless the transport system is horizontally guided with great precision.

But even in the evaporation type depositing systems frequently cited for purposes of comparison, the horizontal direction of transport has been used whenever flexible continuous conveyor means are used:

Thus it is known from German Pat. No. 1,183,337 to suspend plate-like substrates from a horizontal or slightly inclined frame and to carry them in the vertical position successively through a vacuum evaporation zone by means of a horizontal transport chain. As a result, very irregular coating density distributions are produced, since the vapor particles strike the substrate surface at different angles in each position of the substrates and with respect to each unit of the surface of the substrate.

German Pat. No. 1,236,900 has furthermore disclosed a vacuum evaporation apparatus having a conveyor chain circulating substantially in the horizontal direction. In the area of the bottom run of the chain, a plurality of plate-like substrates are arrayed in close order in a vertical position and picked up by the transport chain at certain intervals. The upper run of the chain passes over a plurality of evaporating crucibles. In order to obtain a uniform distribution of the coating thickness, the substrates, while being carried by the upper run of the chain, must be turned to a horizontal position by a special guiding means. Only in this manner it is possible to vapor coat the substrates on one side only. The simultaneous vapor coating of the upper surface, for example by means of special vapor guiding means, has proven impractical despite numerous attempts. With regard to space requirement and the difficulties involved if the vacuum chamber is divided into smaller chambers, the same disadvantages are encountered as in the method previously described.

It is also known to fasten substrates to cylindrical drums whose axis is horizontal. Vapor deposition in this case, however, takes place only on a small portion of the circumference of the drum, because the rest of it serves only as a magazine, and the height and breadth of a drum have an unfavorable influence on the dimensions and volume of the vacuum chamber. Such an apparatus is the subject matter of German Pat. No. 841,626.

Lastly, German DAS No. 2,420,430 also discloses the construction of cylindrical drums as holders of blade-shaped substrates. The drum, however, serves only as a magazine for the blades which are aligned radially with the drum axis, and for their transport. For the purpose of coating by vacuum deposition, the blades are individually shifted from the drum into coating chambers while they are in a substantially horizontal position. The vapor deposition apparatus involved is extraordinarily complex in construction and in operation; in addition, it requires a considerable amount of space due to the large drum diameter.

SUMMARY

The invention provides a vacuum coating apparatus of the kind described in the beginning, i.e., one having at least one cathode system, in which simultaneous coating on both sides will be possible, without the danger that the substrates and/or the cathodes might become contaminated.

This is accomplished in accordance with the invention, in the vacuum coating apparatus described in the beginning, in that the straight sections of each endless conveyor means are vertical at least in the area of the cathode system.

It is, of course, especially desirable for the straight portions of the endless conveyor means to be vertical on their entire length, and this can be accomplished most simply by disposing the pairs of wheels over which the endless conveyor means is guided such that one will be vertically above the other. It is to be noted, however, that a deviation from the exclusively vertical guidance of the transport means can be desirable if, for example, the cathode system is to be combined with a vacuum evaporation system.

DESCRIPTION

The subject of the invention is a complete departure from the design principles of the prior art, and is distinguished by the following advantages: The principal dimensions of the vacuum chamber are substantially vertical, so that only a small amount of floor space is required for the apparatus. The sputtering surfaces of the cathode system or systems, i.e., the target surfaces, are vertical, as are the surfaces of the substrates, at least during the sputtering process. In this manner, no impurities, such as might be produced from the cathodes, can fall on the substrates or vice versa. If the cathode system is a two-sided system, it is easily possible to coat both sides of the substrates simultaneously. The term "substrates," as used herein, is to be understood to apply not only to single substrates of large surface area, but also to multiple arrays of substrates fastened to substrate frames. Two-sided coating includes cases in which substrates are arranged in pairs back to back, so that each individual substrate is coated on one side only, but the two substrates are coated together on their outwardly facing surfaces. Examples of substrates are lenses, mirrors, electrical contacts, wafers, etc.

If the dimensions of the apparatus of the invention are small, i.e., if the pump-down time is short, the apparatus will have a high capacity of production. The flexible endless conveyor means, which consist preferably of endless chains carried around appropriate sprockets, are simple and reliable in design; even if the substrates are comparatively heavy, they require no additional guidance or support, so that even if the vacuum chamber is divided there is no difficulty involved with regard to the sealing of the slits in the partitions adjacent the endless conveyor means. The vacuum chamber can thus be equipped with a plurality of preferably variable stations for the treatment of the substrates. For example, high-frequency cathodes, direct-current cathodes, etching cathodes or heating means can be provided in any desired sequence.

It is especially advantagous to make the horizontal distance between the endless conveyor means, or between the wheels of each set, greater than the horizontal width of the cathode system. This effectively prevents the endless transport means from being coated together with the substrates.

For the purpose of increasing production capacity, the apparatus of the invention can be advantageously developed by providing at the bottom end of the vacuum chamber, in the vicinity of the bottom wheels, a feed chamber containing at least one substrate magazine, and with a means for attaching them and a means for detaching them from the conveyor means. The attaching and detaching means means can in a very simple manner consist of push rods which are the prolongation of hydraulic or pneumatic actuators. If these hydraulic or pneumatic actuators operate in the vertical direction, the substrates can be hooked onto the endless conveyor means and unhooked therefrom in an especially simple and reliable manner, since this procedure is performed in substantially the same direction in which the substrates are moving. In an arrangement of this kind, separate magazines can be used for the uncoated substrates and the coated substrates, within a common lock chamber serving for both the insertion and the removal of the magazines. Thus sufficient time is allowed for preheating and outgassing.

Lastly, by a vertical arrangement of the transport systems, an especially simple and advantageous design of the vacuum chamber can be achieved by making the vacuum chamber to consist of a frame having two doors disposed one on each side of the frame and substantially matching the frame profile, while some of the functional means such as cathodes, heating stations, etc., are mounted on the doors. These functional means are thus easily accessible when the doors are opened—an advantage which is not to be underestimated in view of the need for the replacement of the sputtering target.

Embodiments and their manner of operation and additional advantages will be described hereinafter with reference to FIGS. 1 to 7 wherein.

Figure 1:
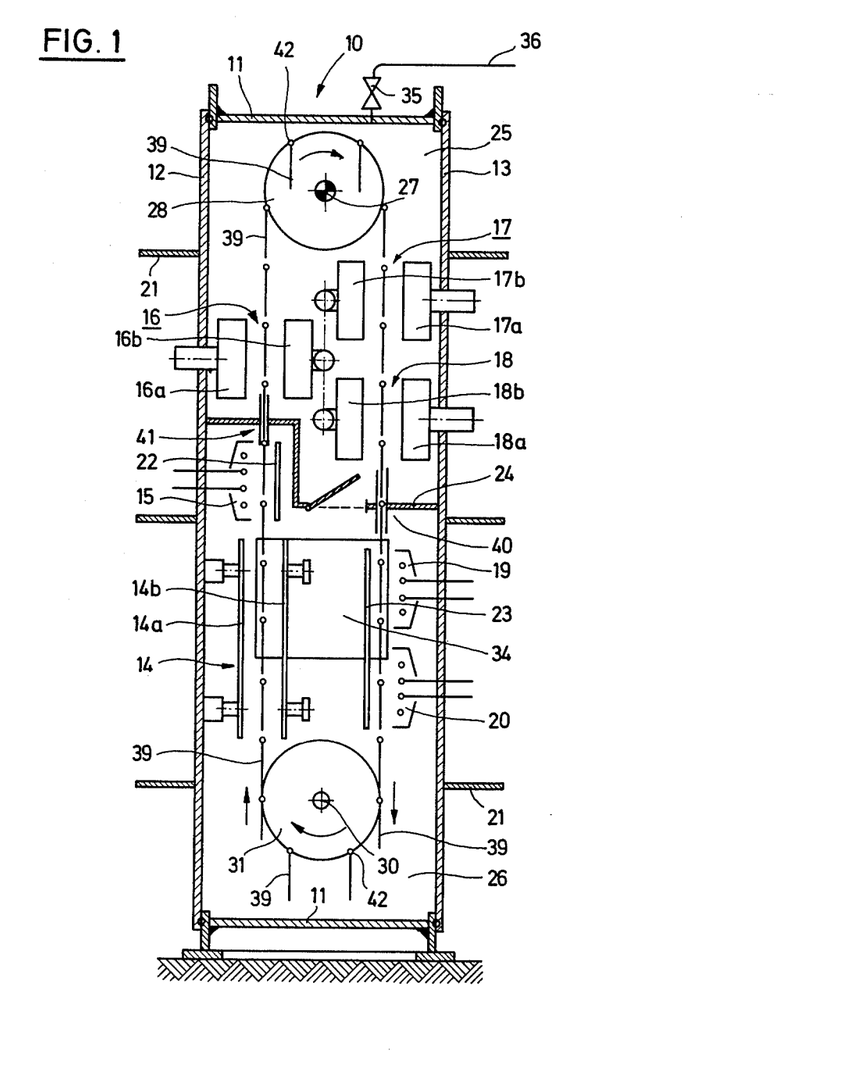
FIG. 1 is a vertical cross section through a vacuum coating apparatus providing a side view of the wheels and the straight sections of a flexible endless conveyor means.

In FIG. 1 there is represented a vacuum chamber 10 which consists of a frame 11 and two doors 12 and 13 whose profile corresponds substantially to the frame outline. To both doors are fastened the means essential to the coating process, that is, on door 12, the outer part 14a of a cathodic etching system 14, a heating system 15, and the outer part 16a of a cathode sputtering system 16. On the opposite door 13 are fastened the outer parts 17a and 18a of cathode sputtering systems 17 and 18, and heating means 19 and 20. The doors 12 and 13 are reinforced by ribs 21 against the atmospheric pressure.

The corresponding internal parts 14b, 16b, 17b and 18b of the cathode systems 14, 16, 17 and 18 are also fastened to the frame 11 in a manner not shown, as are also the reflectors and radiation shields 22 and 23 of the heating means 15, 19 and 20.

The vacuum chamber 10 is divided by a partition 24 into an upper chamber 25 and a lower chamber 26. In the upper chamber 25, there is fastened at the highest possible point to the vertical frame walls 11a and 11b a shaft 27 with a pair of wheels of which only the front wheel 28 is visible in FIG. 1, while in FIG. 2 the rear wheel 29 is also represented.

Figure 2:
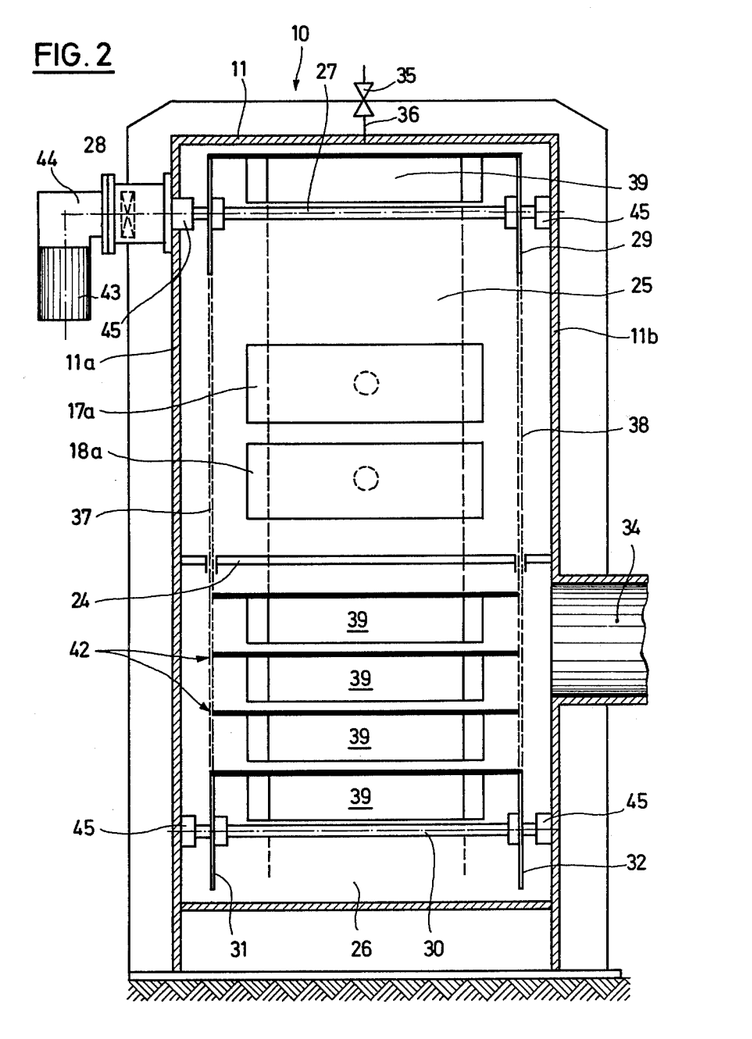
FIG. 2 is a vertical cross section through the subject of FIG. 1 at a right angle thereto, i.e., providing a front view of the target surfaces of two cathode systems and of the substrate surfaces which are to be coated.

In like manner, there is journaled in the lower chamber 26 a shaft 30 on which there is fastened a pair of wheels of which only the front wheel 31 is visible in FIG. 1, while in FIG. 2 the rear wheel 32 is also to be seen. The suction connection 34 leading to a pump set 33 leads into the lower chamber 26, while a gas line 36 for the production of a suitable sputtering atmosphere leads through a gas valve 35 into the upper chamber 25.

A flexible endless conveyor means 37 and 38 is passed around each pair of wheels 28–31 and 29–32, respectively, and it can best consist of a roller chain (FIG. 4), although it can also be constituted by any other slip-free driving means, such as for example ball chains, cogbelts, and the like. Substrates 39 are attached at equal distances to the endless conveyor means 37 and 38, and they can be of many different shapes as described above. The substrates are attached to the endless conveyor means such that their surfaces which are to be coated assume a vertical position due to gravity. In FIG. 1, the course of the flexible endless conveyor means is indicated only by the representation of the substrates 39 and by the corresponding circumferences of wheels 28 and 31. By the arrangement shown, vertical chains of substrates are formed in the embodiments shown in FIGS. 1 and 6 between the wheels 28 and 31 and wheels 29 and 32 within each endless conveyor means 2. The cathode systems 14, 16, 17 and 18 are disposed with respect to the endless transport means or wheels 28–31 and 29–32 such that the vertical runs are in the planes of symmetry between the target surfaces of the cathode systems, but laterally outside of the glow discharge area.

In the partition 24 are the slots 40 and 41 whose cross section is adapted to the maximum cross section of the endless conveyor means and substrates (substrate frames), so that unimpaired passage is just possible if the run is rectilinear. To improve the sealing action, one or both sides of the slots are adjoined by vertically disposed guide plates whose vertical length corresponds preferably to at least the vertical spacing between two substrate suspension points. This will assure that the slot will always be occupied by at least one substrate or substrate frame.

Figure 3:
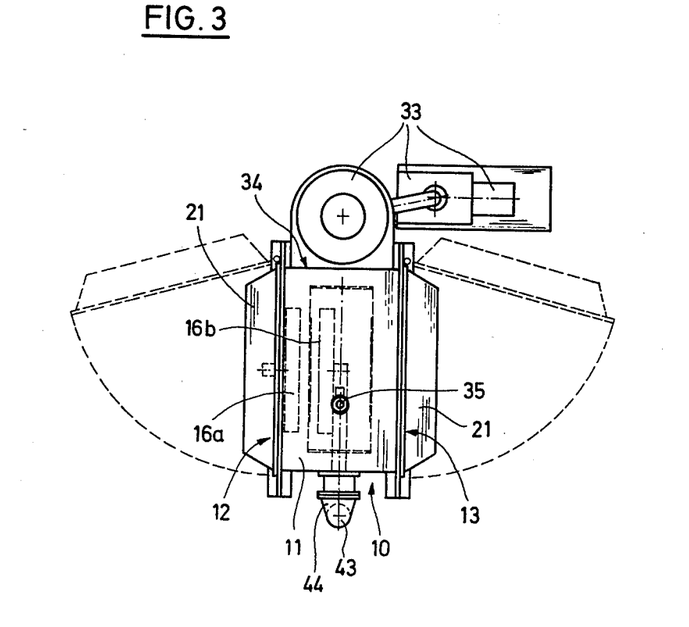
FIG. 3 is a top plan view of the subject of FIGS. 1 and 2 with doors closed (solid lines) and doors open (broken lines).

In FIGS. 1 to 3, heating of the substrates 39 is performed in the lower chamber 26 by means of the heaters 19 and 20. The substrate surface is additionally cleaned by the cathodic etching system 14. The heater 15 performs additional heating to raise the substrate temperature to the level required for the actual coating process. After leaving the heater 15 the substrates pass through the slot 41 into the upper chamber 25 where they can be coated by means of the cathode systems 16, 17 and 18, according to the desired product characteristics. The partition 24 enables different pressures to be established in the two chambers. The substrates 39 emerge from chamber 25 through slots 40 back into the lower chamber 26. The turning over of the substrates 29 at the top of the conveyor system requires, of course, that the radius difference between the semicircle of the suspension points 42 and the shaft 27 be equal to or greater than the vertical length of the substrates 39 measured from the suspension points 42. In FIG. 2 there is shown another drive motor 43 with a gearing 44 for the upper shaft 27 with wheels 28 and 29. The shaft 27 and 30 are held by bearings 45 in the vertical frame walls 11a and 11b.

Figure 4:
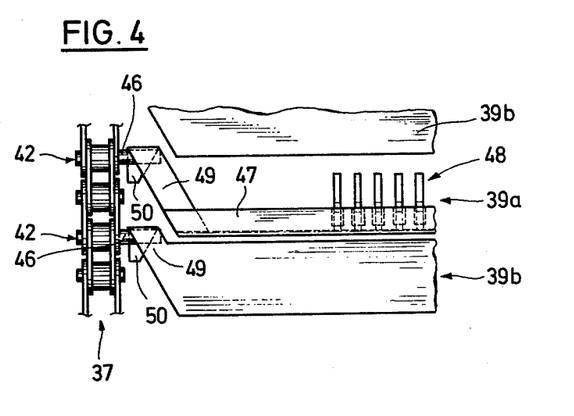
FIGS. 4 and 5 are partial views of the interior of the apparatus to explain the interaction of the substrates with the flexible endless conveyor means.
Figure 5:
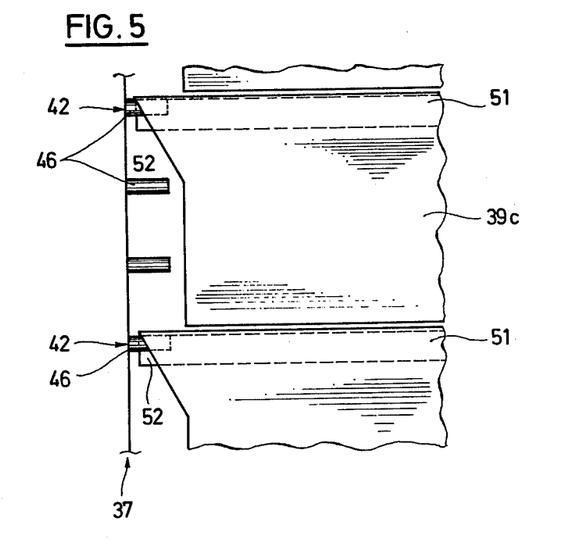

In FIGS. 4 and 5 there is shown an endless conveyor means 37 in the form of a roller chain (FIG. 4) which is provided at equal intervals with hangers 46. The horizontal longitudinal axes of these hangers, which are parallel to shafts 27 and 30, form the suspension points 42 whose distance apart depends on the vertical length of the substrate. The different shapes which the substrates can assume and the manner in which they are attached to the hangers 46 is likewise represented in FIGS. 4 and 5. In FIG. 4, a substrate 39a is represented in the form of a transverse holder 47 having a plurality of contract springs 48 which, after coating, are to be the actual end products, which will be used in reed switches. 39b represents flat substrates or substrate holders. The substrates have at their extremities sheet metal tongues 49 having downturned ends 50, the bending radius corresponding to the radius of the hangers 46. By means of the sheet metal tongues 49 it is possible to hang the substrates 39, 39a and 39b on the hangers 46. In FIG. 5 is represented a similar arrangement wherein the length of the substrates 39c corresponds approximately to the distance between every fourth hanger 46, i.e., every fourth hanger is a suspension point 42. The substrates 39c are provided at their upper margin with a bent-over margin 52 whereby they can be hung on the hangers 46. The arrangement represented in FIGS. 4 and 5 permits the substrates to hang plumb. It is especially suitable for use in conjunction with the device shown in FIG. 6.

Figure 6:
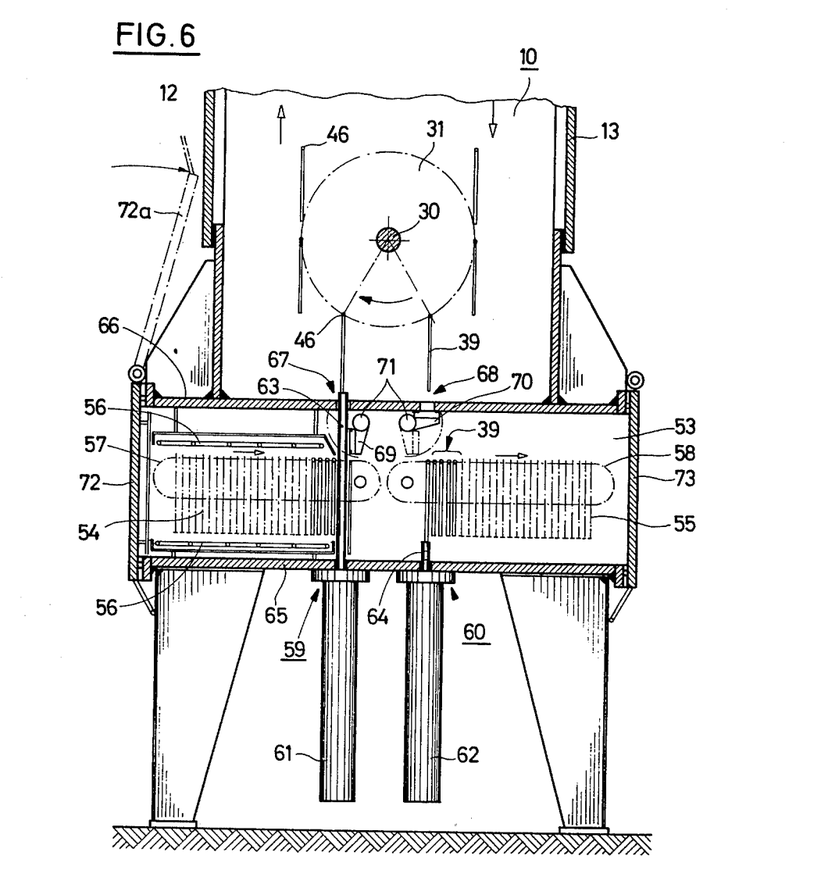
FIG. 6 shows the lower end of the vacuum chamber of FIGS. 1 and 2, with an attachment in the form of a loading chamber containing two substrate magazines.

In FIG. 6, a loading chamber 53 serving as a lock is situated at the bottom end of the vacuum chamber 10 and its compartment 26 and thus below wheels 31–32. In the loading chamber 53 there are disposed two substrate magazines 54 and 55, of which magazine 54 is the loading magazine and magazine 55 the unloading magazine. A heater 56 is associated with the substrate magazine 54. Each of the substrate magazines 54 and 55 consists of pairs of conveyor means 57 and 58, which are in the form of horizontal endless chains and are driven preferably intermittently. With the substrate magazine 54, in an area beneath the wheels 31–32, there is associated an attaching means 59, and with substrate magazine 55 there is associated a detaching means 60, both of them consisting of hydraulic or pneumatic actuators 61 and 62, equipped with vertically movable push rods 63 and 64. The push rods 63 of attaching hooking means serve to hook one of the substrates 39 onto two opposite and aligned hangers 46, only one of which is represented in FIG. 6. In reverse sequence, push rod 64 of the detaching means 60 serves to unhook the substrates 39 one at a time from the hangers 46 and to lower them into the substrate magazine 55 until they come to rest on the conveyor means 58. It can be seen that the attacking and removing take place substantially in the direction of movement of the substrates 39. When the particular substrate is hung on the hangers, it is brought into a position in which the hangers 46 can engage the sheet metal tongues 49 (FIG. 4) or the bent-over margin 52 (FIG. 5). In the detaching operation, the substrate 39 encounters the push rod 64 and is held by it until the hanger 46 becomes disengaged from the tongue 49 or the margin 52, as the case may be.

The loading chamber 53 has a floor 64 to which the hydraulic or pneumatic actuators 61 and 62 are fastened. The push rods 63 and 64 are brought through bores in the floor 65. In a partition wall 66, which constitutes the roof of the loading chamber 53, slots 67 and 68 are disposed in the path of the push rods 63 and 64, and the substrates 39 can pass through them. The slots 67 and 68 can be closed vacuum-tight by means of sealing flaps 69 and 70, which are hinged at 71. The loading chamber 53 can be closed at both ends by doors 72 and 73. By the interaction of the above-described parts, the loading chamber can be made to act as a lock. During the operation of the vacuum chamber 10, when the sealing flaps 69 and 70 are in the closed state, the door 72 can be brought into the position 72a represented by broken lines, so that reloading with uncoated substrates as well as the unloading of coated substrates can be performed without interrupting operation. The door 73 is opened in this case, in a similar manner.

Figure 7:
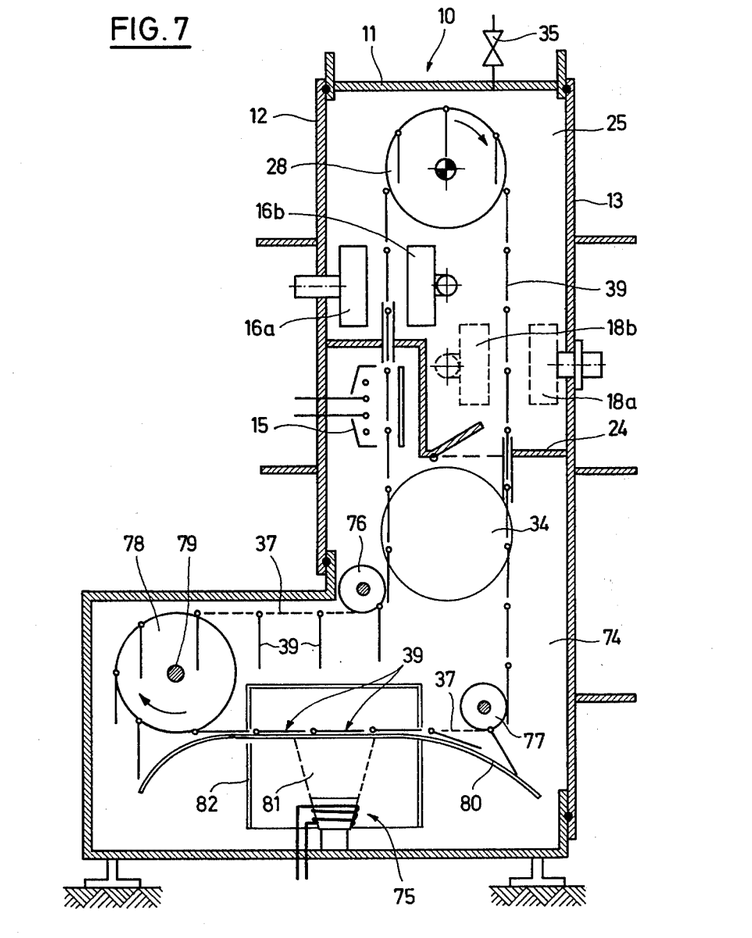
FIG. 7 is a variant of the subject of FIG. 1 in a similar representation, but with the addition of a vacuum vapor deposition system.

In FIG. 7, the upper portion of the vacuum coating apparatus is largely the same as the upper portion of FIG. 1, the same reference numbers being used to avoid repetition. Underneath the partition 24, however, there is a chamber 74 containing a vapor deposition apparatus 75 over which the substrates have to pass in the horizontal direction. For this purpose the endless conveyor means 37 and 38 (endless conveyor means 38 is not shown in FIG. 7) pass over two pulleys 76 and 77 to the horizontal. At the end of the two horizontal runs of the endless conveyor means 37, the latter passes over a wheel 78 which together with an additional wheel, not shown, is mounted on a shaft 79. To change the substrates 39 to the horizontal position, two curved tracks 80 are provided, of which only the rear one is visible in FIG. 7. These curved tracks are situated at the end of the substrates and outside of the vapor stream 81 emerging from the evaporating means 75. The evaporating means 75 is surrounded by a shield 82. As it can be seen in FIG. 7, the overall arrangement of the wheels 28 and 78 and of the pulleys 76 and 77 results in a guidance of the endless conveyor means over an L-shaped course. In this manner, the additional possibility is created of coating the substrates 39 by vacuum evaporation in the chamber 75, without losing the advantages of the vertical transport of the substrates in chamber 25.

What is claimed is:

1. Vacuum coating apparatus comprising vacuum chamber means containing at least one cathode sputtering system and having means for the continuous or intermittent transport of substrates during the coating, said transport means including flexible endless conveyor means in pairs guided in the manner of two parallel chain drives over wheel pair means positioned at a distance from one another in the formation of two straight runs each, said substrates being fastened to the conveyor means so as to be movable parallel to the cathode system, the straight runs of each endless conveyor means being guided vertically at least in the area of the cathode system and wherein the vacuum chamber means includes a frame and two doors corresponding in size substantially to the frame profile positioned on each side of the frame and pivotably mounted thereon for movement between an open and closed position about a vertical axis, at least a portion of the functional devices of the apparatus being fastened to the doors.

2. Coating apparatus of claim 1 wherein the vcuum chamber means is divided by partition means into at least two subchamber means, the endless conveyor means are brought sealingly through the partition wall, and in one subchamber means at least one cathode system is located and in the other sub-chamber means at least one additional treatment means is located.

3. Coating apparatus of claim 2 wherein heater means are located in the other sub-chamber means.

4. Coating apparatus of claim 2 wherein a cathodic etching system is located in the other sub-chamber means.

5. Coating apparatus of claim 2 whereinthe endless conveyor means are turned about in the other subchamber means and guided over a horizontal run, and a vacuum vapor deposition system is positioned adjacent the horizontal run.

6. Coating apparatus of claim 1 wherein oppositely situated points of the endless conveyor means are provided equidistantly with hanger pins aligned with one another.

7. Coating apparatus of claim 1 wherein the horizontal distance between the endless conveyor means or between the wheel of a wheel pair means is greater than the horizontal width of the cathode system.

8. Coating apparatus of claim 1 wherein on the bottom end of the vacuum chamber means and adjacent the lower wheel pair means there is disposed a loading chamber means having at least one substrate magazine means and attaching and detaching means.

9. Coating apparatus of claim 8 wherein at least one substrate magazine means includes conveyor means arranged in pairs, between which the substrates can be suspended, and that the attaching means and detaching means include push rod means for raising and lowering the substrates.

* * * * *